United States Patent
Cho et al.

(10) Patent No.: US 8,765,014 B2
(45) Date of Patent: Jul. 1, 2014

(54) QUANTUM DOT INK COMPOSITION FOR INKJET PRINTING AND ELECTRONIC DEVICE USING THE SAME

(75) Inventors: Kyung Sang Cho, Gwacheon-si (KR); Tae Woon Cha, Seoul (KR)

(73) Assignee: Samsung Electronics Co., Ltd. (KR)

( * ) Notice: Subject to any disclaimer, the term of this patent is extended or adjusted under 35 U.S.C. 154(b) by 1296 days.

(21) Appl. No.: 12/109,843

(22) Filed: Apr. 25, 2008

(65) Prior Publication Data

US 2009/0314991 A1 Dec. 24, 2009

(30) Foreign Application Priority Data

Jan. 14, 2008 (KR) ........................ 10-2008-0003893

(51) Int. Cl.
 C09K 11/02 (2006.01)
 C01F 5/32 (2006.01)
 C01F 5/34 (2006.01)
 C09D 11/00 (2014.01)

(52) U.S. Cl.
 USPC ................... 252/301.36; 423/498; 106/31.15; 106/31.89

(58) Field of Classification Search
 USPC ......... 252/301.36, 301.4 S, 301.4 R, 301.6 S, 252/301.6 R; 106/31.89, 31.59, 31.15; 423/498
 See application file for complete search history.

(56) References Cited

U.S. PATENT DOCUMENTS

| | | | |
|---|---|---|---|
| 6,508,871 B1 * | 1/2003 | Kato et al. | 106/31.27 |
| 6,576,155 B1 * | 6/2003 | Barbera-Guillem | 252/301.36 |
| 7,332,351 B2 * | 2/2008 | Tan et al. | 436/524 |
| 2007/0057263 A1 * | 3/2007 | Kahen | 257/79 |

FOREIGN PATENT DOCUMENTS

KR 10-2005-0060080 6/2005

OTHER PUBLICATIONS

Roche. Triton X-100 MSDS. Sep. 2005.*
Santra. Synthesis and Characterization of Silica-Coated Iron Oxide Nanoparticles in Microemulsion: The Effect of Nonionic Surfactants. Langmuir 2001, 17, 2900-2906.*
Wang. Chemiluminescence of CdTe Nanocrystals Induced by Direct Chemical Oxidation and Its Size-Dependent and Surfactant-Sensitized Effect. J. Phys. Chem. B 2005, 109, 23304-23311.*
Fernández-Argüelles. Surface-modified CdSe quantum dots for the sensitive and selective determination of Cu(II) in aqueous solutions by luminescent measurements. Analytica Chimica Acta vol. 549, Issues 1-2, Sep. 6, 2005, pp. 20-25.*

(Continued)

*Primary Examiner* — Carol M Koslow
*Assistant Examiner* — Matthew E Hoban
(74) *Attorney, Agent, or Firm* — Cantor Colburn LLP

(57) ABSTRACT

Disclosed herein is a quantum dot ink composition for inkjet printing. The quantum dot ink composition comprises a highly viscous polymeric additive. Quantum dots can be ejected by inkjet printing and the concentration of the quantum dots in the quantum dot ink composition can be freely controlled. In addition, the loading amount of the quantum dots can be reduced. Based on these advantages, the quantum dot ink composition can be used as a material for light-emitting layers of a variety of electronic devices. Also disclosed herein is an electronic device fabricated using the quantum dot ink composition.

6 Claims, 3 Drawing Sheets

(56) References Cited

OTHER PUBLICATIONS

Diao. Fluorescence-detecting cationic surfactants using luminescent CdTe quantum dots as probes. Anal Bioanal Chem (2007) 388:1191-1197.*

Yang. Coating Aqueous Quantum Dots with Silica via Reverse Microemulsion Method: Toward Size-Controllable and Robust Fluorescent Nanoparticles. Chem. Mater., 2007, 19 (17), pp. 4123-4128.*

Brian Derby, et al.,"Inkjet Printing of Highly Loaded Particulate Suspensions", MRS Bulletin, Nov. 2003, pp. 815-818.

* cited by examiner

QUANTUM DOT INK COMPOSITION FOR INKJET PRINTING AND ELECTRONIC DEVICE USING THE SAME

PRIORITY STATEMENT

This application claims priority under U.S.C. §119 to Korean Patent Application No. 10-2008-0003893, filed on Jan. 14, 2008, in the Korean Intellectual Property Office (KIPO), the entire contents of which are incorporated herein by reference.

BACKGROUND

1. Field of the Invention

This disclosure is directed to a quantum dot ink composition for inkjet printing and an electronic device fabricated using the same. More specifically, the quantum dot ink composition uses a highly viscous polymeric additive by which quantum dots can be ejected by inkjet printing and the concentration of the quantum dots can be freely controlled.

2. Description of the Related Art

Quantum dots are nanometer-sized semiconductor materials that exhibit quantum confinement effects. Quantum dots absorb light from an excitation source to reach an excited state of energy and radiate energy corresponding to the energy band gap. Therefore, the size control of quantum dots greatly affects the electrical and optical properties of the quantum dots. Based on these characteristics, quantum dots are currently applied to a variety of devices, including light-receiving devices and light-emitting devices.

The formation of thin films using dispersions of quantum dots in organic solvents is mainly achieved by coating techniques such as spin coating. However, coating techniques are not suitable for the formation of thin films over a large area and have limitations in practical use. Inkjet printing enables the formation of thin films on a large scale at low cost and is thus very attractive from the viewpoint of industrial application.

In recent years, a number of electroluminescent devices have been developed using quantum dots as materials for light-emitting layers. A typical electroluminescent device utilizes the phenomenon of light emission from a material when an electric field is applied to the material. Electrons and holes are injected into a light-emitting layer of the electroluminescent device and recombine together to form excitons, which emit light.

Spin coating is predominantly used to form light-emitting layers using quantum dots. Spin coating is, however, is not suitable for the formation of large-area light-emitting layers, which poses problems in mass production. Under the circumstances, inkjet printing is needed to facilitate the formation of light-emitting layers over a large area. An excessively low viscosity of a composition for the formation of a light-emitting layer of a light-emitting device by inkjet printing leads to non-uniformity of the light-emitting layer. Therefore, there is a need for a high-viscosity composition that can be used to form a uniform light-emitting layer of a light-emitting device.

SUMMARY

Disclosed herein is an quantum dot ink composition for inkjet printing, which comprises quantum dots, a solvent and a compound represented by Formula 1 or 2:

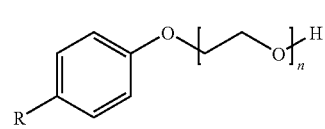

wherein R is H, Cl, F, $NO_2$, $NO_3$, $NH_3$, $C_kH_{2k+1}$ or $C_kH_{2k+1}COO$, n is an integer from 2 to 20, and k is an integer from 1 to 20; or

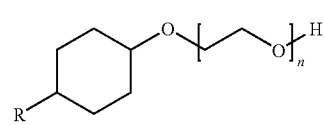

wherein R, n and k are as defined in Formula 1.

The quantum dots can be ejected by inkjet printing and the concentration of the quantum dots can be freely controlled due to the use of the compound of Formula 1 or 2 as an additive.

Disclosed herein too is an electronic device fabricated using the quantum dot ink composition.

Various kinds of quantum dots are applicable to the quantum dot ink composition, and the electronic device can be used as a quantum dot film, a display device, a lighting device, a backlight unit, a color filter, a surface light-emitting device, an electrode, a magnetic memory or a battery.

BRIEF DESCRIPTION OF THE DRAWINGS

Example embodiments will be more clearly understood from the following detailed description taken in conjunction with the accompanying drawings, in which.

DETAILED DESCRIPTION OF EXAMPLE EMBODIMENTS

Figure 1:
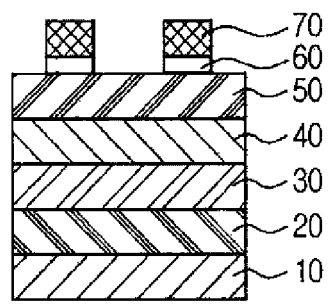
FIG. 1 is an exemplary schematic cross-sectional view of a quantum dot light-emitting device.

Hereinafter, a detailed description will be given of example embodiments with reference to the accompanying drawings.

It will be understood that when an element or layer is referred to as being "on," "interposed," "disposed," or "between" another element or layer, it can be directly on, interposed, disposed, or between the other element or layer or intervening elements or layers may be present.

It will be understood that, although the terms first, second, third, and the like may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, first element, component, region, layer or section discussed below could be termed second element, component, region, layer or section without departing from the teachings of the present invention.

As used herein, the singular forms "a," "an" and "the" are intended to comprise the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

According to one embodiment, there is provided an quantum dot ink composition for inkjet printing, which comprises quantum dots, a solvent and a compound represented by Formula 1 or 2:

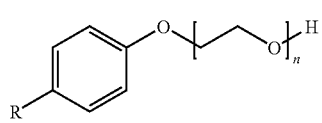

(1)

wherein R is H, Cl, F, $NO_2$, $NO_3$, $NH_3$, $C_kH_{2k+1}$ or $C_kH_{2k+1}COO$, n is an integer from 2 to 20, and k is an integer from 1 to 20; or

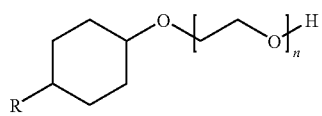

(2)

wherein R, n and k are as defined in Formula 1.

The compound of Formula 1 may be octylphenolpoly(ethylene glycol ether)$_{10}$ of Formula 3:

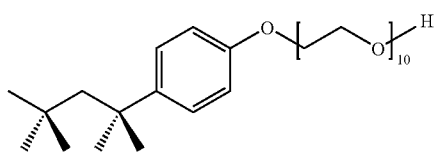

(3)

In general, important parameters in determining the effective jetting of ink include viscosity, density, surface tension and jet diameter of the solution. It is known that the inverse of the Ohnesorge number defined by Equation 1, which is a dimensionless group consisting of the parameters, is preferably 1 to 10 and more preferably 2 to 4 (Refer to MRS bulletin 2003, 815).

$$Z = \frac{\mu}{\sqrt{\rho \sigma D}} \qquad \text{Equation 1}$$

wherein Z is the Ohnesorge number, $\mu$ is the viscosity of the solution, $\rho$ is the density of the solution, $\sigma$ is the surface tension of the solution, and D is the jet diameter.

Diptopylene glycol monomethyl ether acetate (DPMA), polyglycidyl methacrylate (PGMA), diethylene glycol monoethyl ether acetate (EDGAC) and propylene glycol methyl ether acetate (PGMEA) have been used as suitable solvents for inkjet printing. Quantum dots, however, are not dissolved in these solvents. On the other hand, when cyclohexane is used to dissolve quantum dots, the inverse of the Ohnesorge number is 17.42, which means that no quantum dots are ejected upon inkjet printing. At this time, it is necessary to decrease the inverse of the Ohnesorge number to below 10 in order to ensure the ejection of the quantum dot ink. To this end, the viscosity of the quantum dot ink must be adjusted to at least 2~3 cP. For example, a highly viscous material (e.g., ethylene glycol) can be additionally used to decrease the inverse of the Ohnesorge number. Since the viscous material is not readily mixed with other organic solvents, however, the use of another solvent (e.g., butanol (BuOH)) is inevitable. Such additional solvents reduce the solubility of the quantum dots to limit the loading amount of the quantum dots and precipitate the quantum dots.

The quantum dot ink composition uses a Triton-based polymer solution, whose viscosity is at least ten times than that of ethylene glycol, as an additive so that the use of unnecessary solvents (e.g., butanol) can be avoided and the loading amount of quantum dots can be freely controlled.

The quantum dot ink composition is effective in forming a light-emitting layer by inkjet printing.

Examples of the quantum dots as constituents of the quantum dot ink composition include, but are not necessarily limited to, Group II-VI compound semiconductor nanocrystals, Group III-V compound semiconductor nanocrystals, Group IV-VI compound semiconductor nanocrystals, Group IV compound semiconductor nanocrystals, and mixtures thereof.

The Group II-VI compound semiconductor nanocrystals are selected from semiconductor nanocrystals of binary compounds, e.g., CdSe, CdTe, ZnS, ZnSe and ZnTe, ternary compounds, e.g., CdSeS, CdSeTe, CdSTe, ZnSeS, ZnSeTe, ZnSTe, CdZnS, CdZnSe and CdZnTe, and quaternary compounds, e.g., CdZnSeS, CdZnSeTe, CdZnSTe, CdHgSeS, CdHgSeTe, CdHgSTe, HgZnSeS, HgZnSeTe and HgZnSTe, but are not necessarily limited thereto.

The Group III-V compound semiconductor nanocrystals are selected from semiconductor nanocrystals of binary compounds, e.g., GaN, GaP, GaAs, GaSb, InP, InAs and InSb, ternary compounds, e.g., GaNP, GaNAs, GaNSb, GaPAs, GaPSb, InNP, InNAs, InNSb, InPAs, InPSb and GaAlNP, and quaternary compounds, e.g., GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs and InAlPSb, but are not necessarily limited thereto.

The Group IV-VI compound semiconductor nanocrystals are selected from semiconductor nanocrystals of binary compounds, e.g., PbS, PbSe and PbTe, ternary compounds, e.g., PbSeS, PbSeTe, PbSTe, SnPbS, SnPbSe and SnPbTe, and quaternary compounds, e.g., SnPbSSe, SnPbSeTe and SnPbSTe, but are not necessarily limited thereto. The Group IV compound semiconductor nanocrystals are selected from semiconductor nanocrystals of unary compounds, e.g., Si and Ge, and binary compounds, e.g., Sic and SiGe, but are not necessarily limited thereto.

The solvent as a constituent of the quantum dot ink composition may be selected from the group consisting of chloroform, chlorobenzene, cyclohexane, hexane, heptane, octane, hexadecane, undecane, decane, dodecane, xylene, toluene, benzene, octadecane, tetradecane, butyl ether, ethanol and mixtures thereof, but is not necessarily limited thereto.

The compound of Formula 1 or 2 as a constituent of the quantum dot ink composition is preferably present in an amount of about 0.5 to about 20% by weight, based on the total weight of the quantum dot ink composition. The use of the compound of Formula 1 or 2 in an amount smaller than about 0.5% by weight decreases the viscosity of the solution, making it difficult to eject the ink. Meanwhile, the use of the compound of Formula 1 or 2 in an amount greater than about 20% by weight causes an excessive increase in the viscosity of the solution, making it impossible to eject the ink.

The quantum dots as constituents of the quantum dot ink composition are preferably present in an amount of about 0.01 to about 20% by weight, based on the total weight of the quantum dot ink composition. The use of the quantum dots in an amount of less than about 0.01% by weight does not lead to the formation of a substantial quantum dot film. Meanwhile, the use of the quantum dots in an amount exceeding about 20% by weight causes many problems such as increased viscosity of the solution, increased cost arising from the use of a large amount of the quantum dots loaded, and low printing rate.

The solvent as a constituent of the quantum dot ink composition is preferably present in an amount of about 60 to about 95% by weight, based on the total weight of the quantum dot ink composition.

The thickness of a light-emitting layer formed using the quantum dot ink composition is appropriately controllable. In addition, the loading amount of the quantum dots can be reduced. Based on these advantages, the quantum dot ink composition can be used to fabricate a device at low cost.

In accordance with another embodiment, there is provided an electronic device fabricated using the quantum dot ink composition. Various kinds of quantum dots are applicable to the quantum dot ink composition. In addition, the electronic device can be used as to a quantum dot film, a display device, a lighting device, a backlight unit, a color filter, a surface light-emitting device, an electrode, a magnetic memory, or a battery. Furthermore, the electronic device can be fabricated over a large area at reduced cost by using the quantum dot ink composition.

More detailed explanation of the fabrication of a quantum dot light-emitting device as the electronic device will be described below.

FIG. 1 shows a schematic cross-sectional view of the quantum dot light-emitting device. Referring to FIG. 1, the device has a structure in which a substrate 10, a hole injecting electrode 20, a hole transport layer 30, a quantum dot light-emitting layer 40, an electron transport layer 50, an insulating layer 60 and electron injecting electrodes 70 stacked in this order from the bottom of the device, but is not limited to this structure.

The insulating layer 60 is formed of an inorganic or organic insulating material.

Any insulating material can be used to form the insulating layer 60. The inorganic insulating material is preferably selected from the group consisting of, but not necessarily limited to, LiF, $BaF_2$, $TiO_2$, ZnO, $SiO_2$, SiC, $SnO_2$, $WO_3$, $ZrO_2$, $HfO_2$, $Ta_2O_5$, $BaTiO_3$, $BaZrO_3$, $Al_2O_3$, $Y_2O_3$, $ZrSiO_4$, $Si_3N_4$, and TiN.

The organic insulating material is preferably selected from the group consisting of, but not necessarily limited to, polymers, e.g., epoxy resins and phenolic resins, 3-(4-biphenylyl)-4-phenyl-5-tert-butylphenyl-1,2,4-triazole (TAZ), 3,4,5-triphenyl-1,2,4-triazole, and 3,5-bis(4-tert-butylphenyl)-4-phenyl-1,2,4-triazole.

The substrate 10 may be a substrate used in typical light-emitting devices. A glass or transparent plastic substrate is preferred because of its high transparency, superior surface smoothness, ease of handling, and excellent waterproofness. Specific examples of the substrate include glass, polyethylene terephthalate, and polycarbonate substrates. The thickness of the substrate is preferably in the range of about 0.3 mm to about 1.1 mm, but is not limited to this range.

The hole injecting electrode 20 formed on the substrate can be made of a conductive metal or its oxide so that holes can be easily injected. Specific examples of suitable materials for the hole injecting electrode include, but are not necessarily limited to, indium tin oxide (ITO), indium zinc oxide (IZO), nickel (Ni), platinum (Pt), gold (Au), silver (Ag), iridium (Ir), and oxides of these metals.

Any material capable of transporting holes can be used to form the hole transport layer 30, and examples thereof include poly(3,4-ethylenedioxythiophene (PEDOT)/polystyrene parasulfonate (PSS), poly-N-vinylcarbazole, polyphenylenevinylene, polyparaphenylene, polymethacrylate, poly (9,9-octylfluorene), poly(spiro-fluorene), N,N'-diphenyl-N, N'-bis(3-methylphenyl)-1,1'-biphenyl-4,4'-diamine (TPD), N,N'-di(naphthalen-1-yl)-N—N'-diphenyl-benzidine, tris(3-methylphenylphenylamino)-triphenylamine (m-MTDATA), poly(9,9'-dibctylfluorene-co-N-(4-butylphenyl)diphenylamine) (TFB), copper phthalocyanine, polyvinylcarbazole (PVK), and derivatives thereof; starburst materials; metal oxides, e.g., $TiO_2$, ZnO, $SiO_2$, $SnO_2$, $WO_3$, $ZrO_2$, $HfO_2$, $Ta_2O_5$, $BaTiO_3$, $BaZrO_3$, $Al_2O_3$, $Y_2O_3$ and $ZrSiO_4$; and semiconductors having a bandgap of 2.4 eV or higher, e.g., CdS, ZnSe and ZnS. The thickness of the hole transport layer 30 is preferably in the range of about 10 nm to about 100 nm, but is not limited to this range.

Any organic or inorganic material capable of transporting electrons can be used to form the electron transport layer 50. Examples of preferred inorganic materials for the electron transport layer 50 include metal oxides, e.g., $TiO_2$, ZnO, $SiO_2$, $SnO_2$, $WO_3$, $ZrO_2$, $HfO_2$, $Ta_2O_5$, $BaTiO_3$, $BaZrO_3$, $Al_2O_3$, $Y_2O_3$ and $ZrSiO_4$, and semiconductors having a bandgap 2.4 eV or higher, such as CdS, ZnSe and ZnS. The organic material may be an electron transport material used in OLED devices. Examples of suitable organic materials for the electron transport layer 50 include, but are not necessarily limited to, tris(8-hydroxyquinolinato)aluminum (Alq3), tris(5-hydroxymethyl-8-quinolinolato)aluminum (AlOq), (salicylidene-O-aminophenolato) (8-quinolinolato)aluminum (Al(Saph-q)), 2-biphenyl-4-yl-5-(4-t-butylphenyl)-1,3,4-oxadiazole (PBD), and 2,2',2"-(benzene-1,3,5-triyl)-tris(1-phenyl-1H-benzimidazole) (TPBI).

The thickness of the electron transport layer 50 is preferably in the range of about 10 nm to about 100 nm, but is not limited to this range.

Non-limiting examples of suitable materials for the electron injecting electrodes 70 include I, Ca, Ba, Ca/Al alloys, Al, Mg, and Ag/Mg alloys. The thickness of the electron injecting electrodes 70 is preferably in the range of about 50 nm to about 300 nm, but is not limited to this range.

When an voltage is applied between the hole injecting electrode 20 and the electron injecting electrodes 70, holes are injected from the hole injecting electrode 20 into the hole transport layer 30 and electrons are injected from the electron injecting electrodes 70 into the electron transport layer 60. The injected holes and electrons combine together at the same molecules to form excitons. The excitons recombine to emit light.

The device using quantum dots as materials for the light-emitting layer 40 exhibits excellent characteristics in terms of luminescence efficiency and dolor purity, compared to inorganic electroluminescent devices using phosphors. Phosphors used in conventional inorganic electroluminescent devices have a non-uniform size distribution of several hundreds of nanometer to several tens of millimeters. In contrast, the thickness of the light-emitting layer formed using nanometer-sized quantum dots (about 5 nm) can be reduced by a factor of at least 1,000 compared to that of conventional phosphor layers, resulting in a reduction in the operation voltage of the device. In addition, the quantum dot light-emitting device using quantum dots composed of an inorganic material as light-emitting materials offers the advantages of excellent thermal and mechanical stability and prolonged lifetime over OLED devices using organic phosphors as light-emitting materials.

A better understanding of exemplary embodiments will be described in more detail with reference to the following examples.

EXAMPLES

Preparative Example 1

Figure 2:
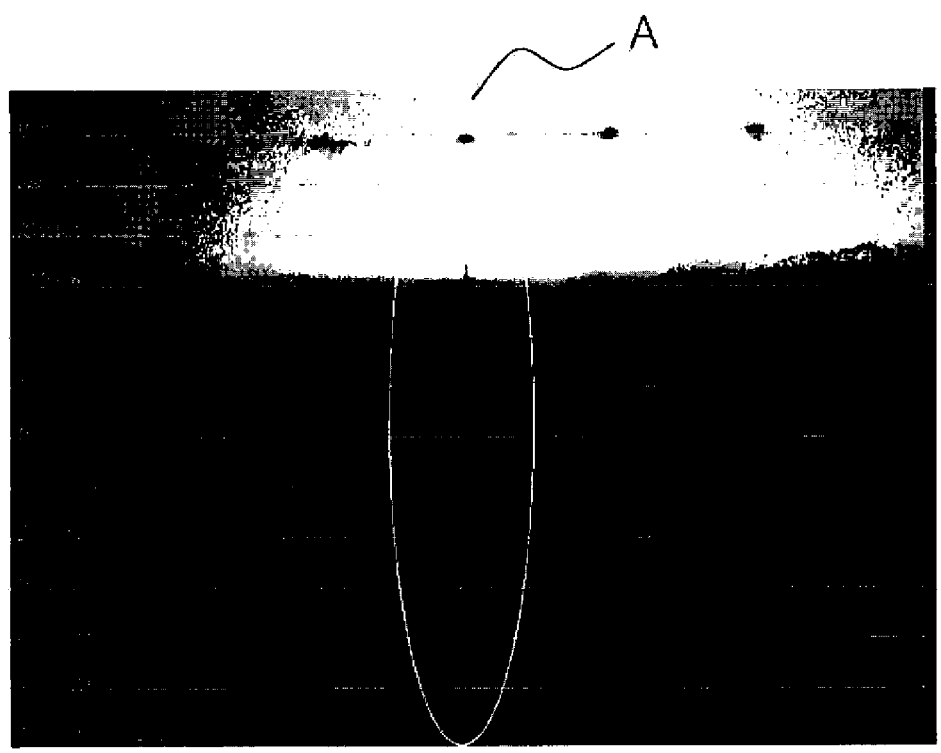
FIG. 2 is a photograph taken when a quantum dot ink composition prepared in Preparative Example 1 was ejected by inkjet printing.
Figure 3:
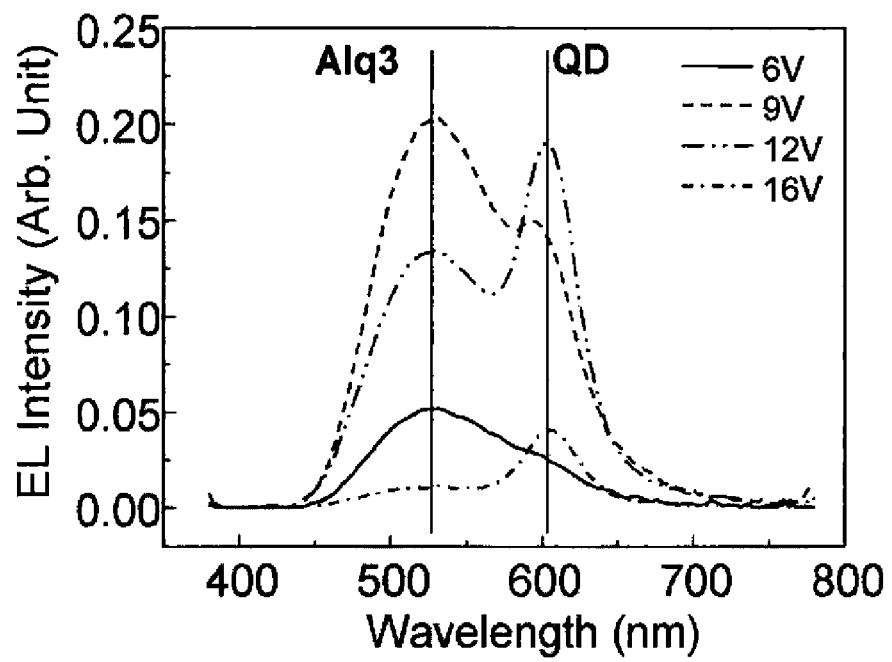
FIG. 3 is a graph showing the variations in the luminescence intensity of a quantum dot light-emitting device fabricated in Preparative Example 2 with varying voltages.
Figure 4:
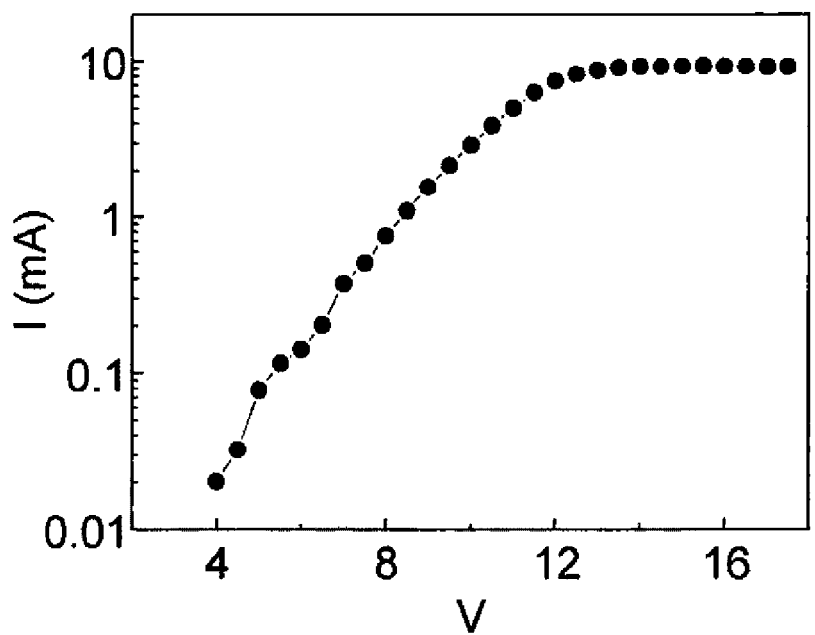
FIG. 4 is a graph showing the variations in the current of a quantum dot light-emitting device fabricated in Preparative Example 2 with varying voltages.

Preparation of Quantum Dot Ink Composition for Inkjet Printing 0.1 g of CdSe/ZnS nanocrystals with a PL wavelength of 620 nm were mixed with a mixed solvent of 70 g of chlorobenzene and 24.9 g of cyclohexane, and 5 g of Ttiton X-100 as an additive was added to the mixture to prepare a quantum dot ink composition for inkjet printing. A photograph was taken during the ejection of the quantum dot ink composition by inkjet printing (FIG. 2). Area A in the figure reveals the ejection of the quantum dot ink.

Preparative Example 2

Fabrication of Quantum Dot Light-emitting Device

Indium tin oxide (ITO) was patterned on a glass substrate 10 to form a hole injecting electrode 20. The ITO-coated substrate was sequentially cleaned with a neutral detergent, deionized water and isopropyl alcohol, and treated with UV-ozone. A solution of poly(3,4-ethylenedioxythiophene) (PEDOT, 1 wt %) in chlorobenzene was spin-coated to a thickness of about 50 nm on the coated substrate and baked at 18° C. for 10 minutes to form a hole transport layer 30.

Subsequently, the quantum dot ink composition prepared in Preparative Example 1 was ejected using an inkjet printer (DMP 2831, Dimatrix) to form a light-emitting layer 40 containing the quantum dots. At this time, the quantum dot ink composition was uniformly ejected drop by drop (one drop: about 10 pL) at intervals of 10 mm. Tris(8-hydroxyquinolinato)aluminum (Alq3) was deposited by thermal evaporation to form an electron transport layer 50. The thickness of the electron transport layer 50 was about 40 nm. LiF was deposited to a thickness of about 0.5 nm on the electron transport layer by thermal evaporation to form an insulating layer 60, and aluminum (Al) was deposited to a thickness of about 200 nm on the insulating layer by thermal evaporation to form electron injecting electrodes 70, completing the fabrication of a quantum dot light-emitting device.

Figure 5:
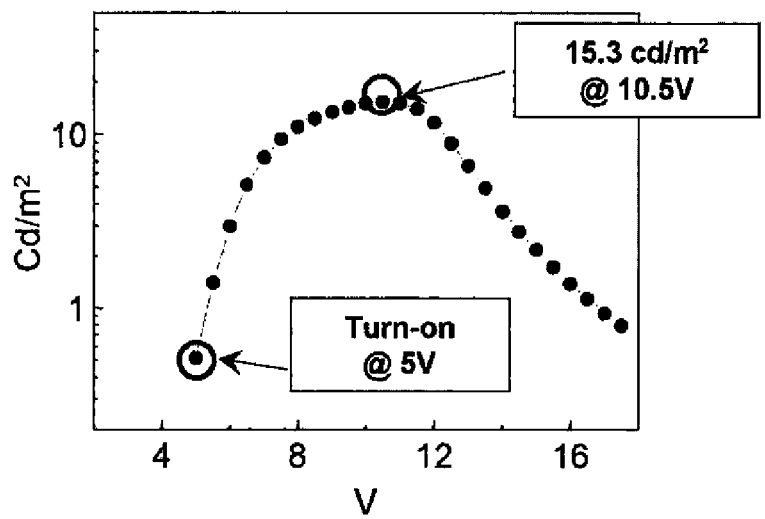
FIG. 5 is a graph showing the variations in the luminance of a quantum dot light-emitting device fabricated in Preparative Example 2 with varying voltages.
Figure 6:
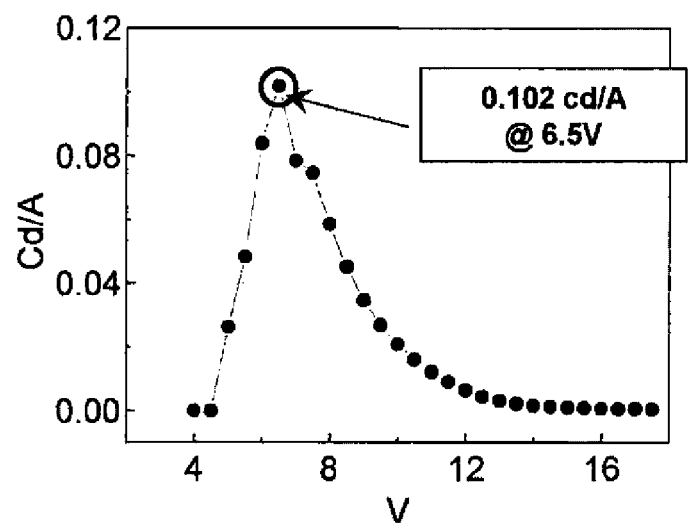
FIG. 6 is a graph showing the variations in the luminescence efficiency of a quantum dot light-emitting device fabricated in Preparative Example 2 with varying voltages.

The variations in the characteristics of the quantum dot light-emitting device were measured in response to a voltage applied to the device. Specifically, FIGS. 3, 4, 5 and 6 are graphs showing the variations in the luminescence intensity, current, luminance and luminescence efficiency of the quantum dot light-emitting device as a function of the voltage, respectively. The graph of FIG. 5 shows that the device had a turn-on voltage of 5 V, a maximum luminance of 15.3 cd/m$^2$ at 10.5 V and a high luminescence efficiency.

Although example embodiments have been described herein with reference to the foregoing preferred embodiments, those skilled in the art will appreciate that various modifications and changes are possible without departing from the spirit of the invention as disclosed in the accompanying claims. It is to be understood that such modifications and changes are within the scope of the invention.

What is claimed is:

1. An quantum dot ink composition for inkjet printing, comprising semiconducting quantum dots, a solvent and a compound represented by Formula 1 or 2:

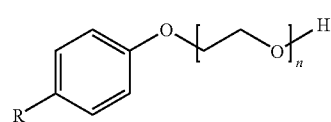

wherein R is H, Cl, F, NO$_2$, NO$_3$, NH$_3$, or C$_k$H$_{2k+1}$COO, n is an integer from 2 to 20, and k is an integer from 1 to 20; or

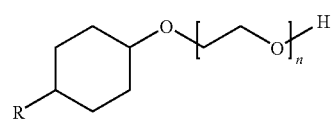

wherein R, n and k are as defined in Formula 1, where the solvent is selected from the group consisting of chloroform, chlorobenzene, cyclohexane, heptane, octane, hexadecane, undecane, decane, dodecane, xylene, toluene, benzene, octadecane, tetradecane, butyl ether, and mixtures thereof.

2. The quantum dot ink composition of claim 1, wherein the composition comprises about 0.5 to about 20% by weight of the compound of Formula 1 or 2, about 0.01 to about 20% by weight of the quantum dots, and about 60 to about 95% by weight of the solvent, based on the total weight of the composition.

3. The quantum dot ink composition of claim 1, wherein the quantum dots are selected from the group consisting of Group II-VI compound semiconductor nanocrystals, Group III-V compound semiconductor nanocrystals, Group IV-VI compound semiconductor nanocrystals, Group IV compound semiconductor nanocrystals, and mixtures thereof.

4. The quantum dot ink composition of claim 3, wherein the Group II-VI compound semiconductor nanocrystals are selected from the group consisting of semiconductor nanocrystals of binary compounds, including CdSe, CdTe, ZnS, ZnSe and ZnTe, ternary compounds, including CdSeS, CdSeTe, CdSTe, ZnSeS, ZnSeTe, ZnSTe, CdZnS, CdZnSe and CdZnTe, and quaternary compounds, including CdZnSeS, CdZnSeTe, CdZnSTe, CdHgSeS, CdHgSeTe, CdHgSTe, HgZnSeS, HgZnSeTe and HgZnSTe; the Group III-V compound semiconductor nanocrystals are selected from the group consisting of semiconductor nanocrystals of binary compounds, including GaN, GaP, GaAs, GaSb, InP, InAs and InSb, ternary compounds, including GaNP, GaNAs, GaNSb, GaPAs, GaPSb, InNP, InNAs, InNSb, InPAs, InPSb and GaAlNP, and quaternary compounds, including GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs and InAlPSb; the Group IV-VI compound semiconductor nanocrystals are selected from the group consisting of semiconductor nanocrystals of binary compounds, including PbS, PbSe and PbTe, ternary compounds, including PbSeS, PbSeTe, PbSTe, SnPbS, SnPbSe and SnPbTe, and quaternary compounds, including SnPbSSe, SnPbSeTe and SnPbSTe; and the Group IV compound semiconductor nanocrystals are selected from the group consisting of semiconductor nanocrystals of unary compounds, including Si and Ge, and binary compounds, including SiC and SiGe.

5. An electronic device comprising: a substrate;
a hole injecting electrode;
a hole transport layer;
a quantum dot light-emitting layer; where the quantum dot light-emitting layer comprises:
a compound represented by Formula 1 or 2:

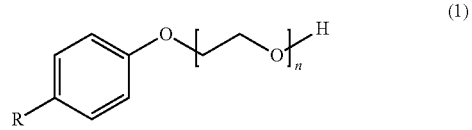

(1)

wherein R is H, Cl, F, $NO_2$, $NO_3$ $NH_3$, or $C_kH_{2k+1}COO$, n is an integer from 2 to 20, and k is an integer from 1 to 20; or

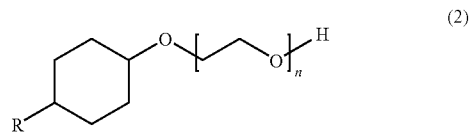

(2)

wherein R, n and k are as defined
in Formula 1;
an electron transport layer;
an insulating layer; and
an electron injecting electrode.

6. The electronic device of claim 5, wherein the electronic device is a quantum dot film, a display device, a lighting device, a backlight unit, a color filter, a surface light-emitting device, an electrode, a magnetic memory, or a battery.

* * * * *